United States Patent
Sasaki

(10) Patent No.: US 7,825,018 B2
(45) Date of Patent: Nov. 2, 2010

(54) PLASMA OXIDATION METHOD AND METHOD FOR MANUFACTURING SEMICONDUCTOR DEVICE

(75) Inventor: Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/281,046

(22) PCT Filed: Feb. 27, 2007

(86) PCT No.: PCT/JP2007/053561

§ 371 (c)(1),
(2), (4) Date: Aug. 28, 2008

(87) PCT Pub. No.: WO2007/099922

PCT Pub. Date: Sep. 7, 2007

(65) Prior Publication Data

US 2009/0047778 A1    Feb. 19, 2009

(30) Foreign Application Priority Data

Feb. 28, 2006   (JP) .............................. 2006-052014

(51) Int. Cl.
*H01L 21/3205*  (2006.01)
*H01L 21/4763*  (2006.01)

(52) U.S. Cl. ................... 438/594; 438/771; 438/592; 438/788; 118/715

(58) Field of Classification Search ........................ None
See application file for complete search history.

(56) References Cited

U.S. PATENT DOCUMENTS

2008/0032511 A1*   2/2008   Kabe et al. ................... 438/771
2008/0093658 A1*   4/2008   Shiozawa et al. ............ 257/321

FOREIGN PATENT DOCUMENTS

| JP | 2001 015753 | | 1/2001 |
| JP | 2006 049779 | | 2/2006 |
| WO | 2004 073073 | | 8/2004 |
| WO | 2006 016642 | | 2/2006 |
| WO | WO 2006016642 A1 * | 2/2006 |
| WO | WO 2006070685 A1 * | 7/2006 |

\* cited by examiner

*Primary Examiner*—Ha Tran T Nguyen
*Assistant Examiner*—Shantanu C Pathak
(74) *Attorney, Agent, or Firm*—Oblon, Spivak, McClelland, Maier & Neustadt, L.L.P.

(57) ABSTRACT

A plasma oxidation processing method is performed, on a structural object including a silicon layer and a refractory metal-containing layer, to form a silicon oxide film. A first plasma oxidation process is performed by use of a process gas including at least hydrogen gas and oxygen gas and a process pressure of 1.33 to 66.67 Pa. A second plasma oxidation process is performed by use of a process gas including at least hydrogen gas and oxygen gas and a process pressure of 133.3 to 1,333 Pa, after the first plasma oxidation process.

20 Claims, 9 Drawing Sheets

US 7,825,018 B2

PLASMA OXIDATION METHOD AND METHOD FOR MANUFACTURING SEMICONDUCTOR DEVICE

TECHNICAL FIELD

The present invention relates to a plasma oxidation processing method and semiconductor device manufacturing method, in which a semiconductor substrate is processed by use of plasma

BACKGROUND ART

In recent years, owing to the demands for higher integration degrees and higher operation speeds of LSIs, design rules for semiconductor devices that constitute LSIs are increasingly miniaturized. Along with this trend, the resistivity of transistor gate electrodes used in DRAMs, flash memories, and so forth is required to be lower. Conventionally, poly-silicon is used for gate electrodes, but entailing a disadvantage such that it increases the sheet resistance. Accordingly, it has been proposed to laminate a poly-silicon layer with a silicide layer of a refractory metal, such as tungsten, which is low in resistivity, high in adhesion to silicon, and good in processability. Specifically, for example, gate electrodes having a metal polycide structure, such as tungsten polycide (a laminated film of WSi/poly-Si) have attracted attention.

In general, where a transistor gate is set up, a well, a gate insulating film, and a gate electrode are formed in this order. When the gate electrode is formed, an etching process is performed. With this process, a side surface of a poly-silicon layer included in the gate electrode is exposed. When a voltage is applied to the gate electrode, an electric field is concentrated at this exposed portion and may cause malfunctions of the product, such as an increase in leakage current. Accordingly, it is necessary to perform an oxidation process to oxidize the exposed poly-silicon portion of the gate electrode, thereby forming an insulating film thereon. This oxidation of poly-silicon is conventionally performed by thermal oxidation. However, there has been proposed a plasma oxidation process utilizing plasma for the same purpose (for example, WO 2004/073073).

Where a poly-silicon layer is oxidized by plasma and the plasma oxidation conditions are suitably selected, the poly-silicon layer can be preferentially oxidized while oxidation of a metal-containing layer is being suppressed. Further, in this case, the poly-silicon layer is prevented from being bitten by an oxide film portion, which is called "birds-beak", at its edge portions.

However, if formation of the birds-beak is suppressed too much when a poly-silicon layer is oxidized by plasma, the shape of the edge portions of the poly-silicon layer essentially unchanged with an acute angle. In this case, an electric field is concentrated at these portions and may increase leakage current. For this reason, the plasma oxidation conditions are reversely selected, so that oxidation is developed in a lateral direction at the edge portions of a poly-silicon layer to form a portion so called a birds-beak.

However, where a poly-silicon layer is oxidized by a plasma oxidation process to form a birds-beak at the edge portions of a gate electrode having a metal polycide structure, the process conditions need to be selected to provide a relatively strong oxidizing effect, which entails a decrease in the oxidation selectivity of poly-silicon relative to a metal in the metal silicide layer. Consequently, the metal in the metal silicide layer is oxidized, and brings about problems, such as a shape distortion due to expansion of the metal silicide layer or the like, and particle generation due to metal oxides, which drastically deteriorate the reliability of semiconductor devices.

DISCLOSURE OF INVENTION

An object of the present invention is to provide a plasma oxidation processing method, performed on a structural object including a silicon layer and a metal-containing layer, for oxidizing the silicon layer to form a silicon oxide film, wherein the method can form the oxide film to have a birds-beak shape with a moderate thickness at an edge portion of the silicon layer, while inhibiting oxidation of a metal in the metal-containing layer.

According to a first aspect of the present invention, there is provided a plasma oxidation processing method for performing an oxidation process on a structural object including at least a silicon layer and a metal-containing layer, thereby forming a silicon oxide film on at least the silicon layer, the method comprising: performing a first plasma oxidation process by use of a process gas including at least hydrogen gas and oxygen gas and a process pressure of 1.33 to 66.67 Pa; and performing a second plasma oxidation process by use of a process gas including at least hydrogen gas and oxygen gas and a process pressure of 133.3 to 1,333 Pa, after the first plasma oxidation process.

According to a second aspect of the present invention, there is provided a semiconductor device manufacturing method comprising: forming an insulating film on a semiconductor substrate; forming a laminated film including at least a poly-silicon layer and a metal-containing layer on the insulating film; performing an etching process on the laminated film, thereby forming a laminated structure of a poly-silicon layer and a metal silicide layer; performing a first plasma oxidation process on the laminated structure by use of a process gas including at least hydrogen gas and oxygen gas and a process pressure of 1.33 to 66.67 Pa; and performing a second plasma oxidation process by use of a process gas including at least hydrogen gas and oxygen gas and a process pressure of 133.3 to 1,333 Pa, after the first plasma oxidation process.

According to a third aspect of the present invention, there is provided a plasma oxidation processing method for performing an oxidation process on a substrate including an oxide film, a first poly-silicon layer, an insulating film, a second poly-silicon layer, and a metal-containing layer sequentially formed in this order from below, thereby forming a silicon oxide film on at least the first and second poly-silicon layers, the method comprising: performing a first plasma oxidation process by use of a process gas including at least hydrogen gas and oxygen gas and a process pressure of 1.33 to 66.67 Pa; and performing a second plasma oxidation process by use of a process gas including at least hydrogen gas and oxygen gas and a process pressure of 133.3 to 1,333 Pa, after the first plasma oxidation process.

In the first aspect, typically, the silicon layer and the metal-containing layer may be a poly-silicon layer and a metal silicide layer, respectively, which are laminated to form a laminated structure as the structural object. The metal silicide layer may be a tungsten silicide layer.

In the first to third aspects, where the silicon layer and the metal-containing layer are a poly-silicon layer and a metal silicide layer, respectively, the first plasma oxidation process and the second plasma oxidation process are preferably performed by use of a process temperature of 250 to 800° C.

The first plasma oxidation process may be arranged to oxidize a surface of the poly-silicon layer and to oxidize silicon at a surface of the metal silicide layer, so as to form a silicon oxide film on the surface of the poly-silicon layer and the surface of the metal silicide layer. In this case, the second plasma oxidation process may be arranged to further develop oxidation at the surface of the poly-silicon layer and the surface of the metal silicide layer and to develop oxidation at an edge portion of the poly-silicon layer.

In the first to third aspects, the plasma oxidation processes may be performed in a plasma processing apparatus including a planar antenna with a plurality of slots formed therein, by which microwaves are supplied into a process chamber to generate plasma.

In the second aspect, the semiconductor device may be a MOS transistor.

In the second aspect, the poly-silicon layer may comprise a first poly-silicon layer and a second poly-silicon layer with an insulating film interposed therebetween. In this case, the first poly-silicon layer may be a floating gate electrode and the second poly-silicon layer may be a control gate electrode. The insulating film may include an oxide film, a nitride film, and an oxide film sequentially laminated. A semiconductor device having such a structure may be a flash memory device.

According to a fourth aspect of the present invention, there is provided a storage medium that stores a program for execution on a computer to control a plasma processing apparatus, wherein the program, when executed, causes the computer to control the processing apparatus to conduct a plasma oxidation processing method for performing an oxidation process on a structural object including at least a silicon layer and a metal-containing layer, thereby forming a silicon oxide film on at least the silicon layer, the method comprising: performing a first plasma oxidation process by use of a process gas including at least hydrogen gas and oxygen gas and a process pressure of 1.33 to 66.67 Pa; and performing a second plasma oxidation process by use of a process gas including at least hydrogen gas and oxygen gas and a process pressure of 133.3 to 1,333 Pa, after the first plasma oxidation process.

According to a fifth aspect of the present invention, there is provided a plasma processing apparatus comprising: a process chamber configured to be vacuum-exhausted and to process a target object by use of plasma; a planar antenna with a plurality of slots formed therein, by which microwaves are supplied into the process chamber; and a control section that exercises control to conduct a plasma oxidation processing method for performing an oxidation process on a structural object including at least a silicon layer and a metal-containing layer, thereby forming a silicon oxide film on at least the silicon layer, the method comprising: performing a first plasma oxidation process by use of a process gas including at least hydrogen gas and oxygen gas and a process pressure of 1.33 to 66.67 Pa; and performing a second plasma oxidation process by use of a process gas including at least hydrogen gas and oxygen gas and a process pressure of 133.3 to 1,333 Pa, after the first plasma oxidation process.

According to the present invention, where an oxidation process is performed on a structural object including at least a silicon layer and a metal-containing layer to form a silicon oxide film on a surface of the silicon layer, a sequence comprising two plasma oxidation processes described above is employed. Consequently, oxidation at an edge portion of the silicon layer is suitably controlled to form a birds-beak shaped portion having a moderate thickness in the oxide film while inhibiting oxidation of a metal in the refractory metal-containing layer.

Specifically, as regards a sequence comprising two plasma oxidation processes using different process pressures, at first, the first plasma oxidation process is performed by use of conditions that provide high oxidation selectivity of silicon relative to metal, so that an oxide film is formed on a surface of the metal-containing layer, typically a metal silicide layer. The oxide film thus formed serves as a protection film in the second plasma oxidation process performed by use of a higher pressure than that of the first plasma oxidation process, so that oxidation of a metal in the metal silicide layer is suppressed. Consequently, particle generation and expansion of the metal silicide layer due to oxidation of the metal are prevented.

In the second plasma oxidation process performed by use of a higher pressure than that of the first plasma oxidation process, oxidation is positively developed at an edge portion of the silicon layer, and a birds-beak shaped portion having a moderate thickness is thereby formed in the oxide film at the edge portion of the silicon layer. Consequently, leakage current in semiconductor devices is suppressed to improve electric characteristics.

Where the method is performed in a plasma processing apparatus including a planar antenna with a plurality of slots formed therein, by which microwaves are supplied into a process chamber to generate plasma, the processes can be performed by use of plasma with a high density and a low electron temperature. In this case, an oxide film can be formed with less damage to the substrate and high controllability, and particularly, a birds-beak shaped portion can be formed with high controllability in the oxide film at an edge portion of the silicon film.

BEST MODE FOR CARRYING OUT THE INVENTION

Figure 1:
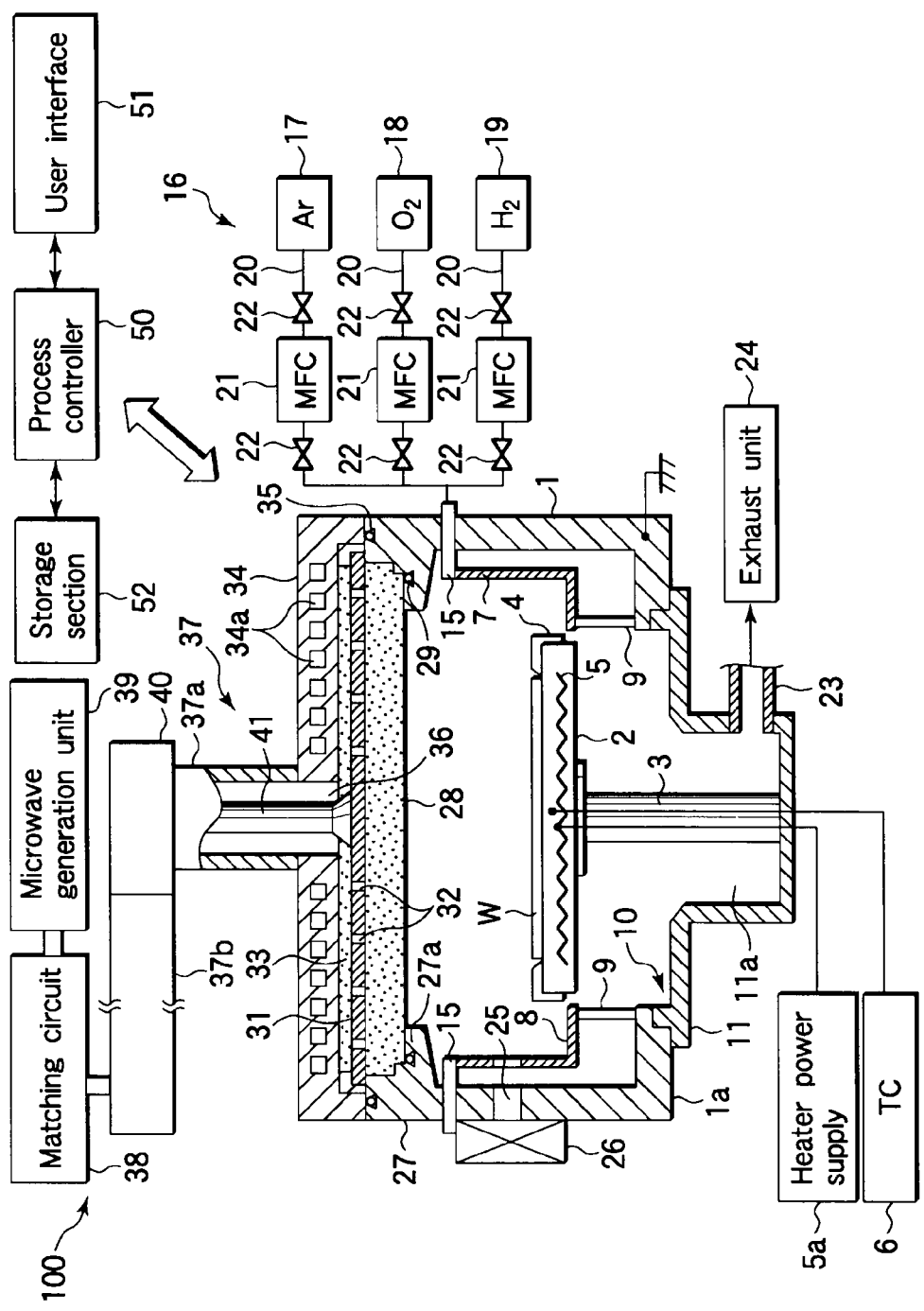
FIG. 1 This is a sectional view schematically showing an example of a plasma processing apparatus suitable for performing a method according to the present invention.

An embodiment of the present invention will now be described with reference to the accompanying drawings. FIG.

1 is a sectional view schematically showing an example of a plasma processing apparatus suitable for performing a plasma oxidation processing method according to the present invention. This plasma processing apparatus 100 is arranged as a processing apparatus of the RLSA (Radial Line Slot Antenna) microwave plasma type, in which microwaves are supplied from a planar antenna having a plurality of slots into a process chamber to generate plasma. In this case, microwave excitation plasma is generated with a high density and a low electron temperature, such as a plasma density of $1 \times 10^{10}$ to $5 \times 10^{12}/cm^3$ and a low electron temperature of 0.7 to 2 eV, and so a plasma process can be performed while suppressing plasma damage. Accordingly, apparatuses of this type are preferably utilized for processes, such as formation of a silicon oxide film, in manufacturing various semiconductor devices.

This plasma processing apparatus 100 includes an essentially cylindrical chamber 1, which is airtight and grounded. The bottom wall 1a of the chamber 1 has a circular opening 10 formed essentially at the center, and is provided with an exhaust chamber 11 communicating with the opening 10 and extending downward. The exhaust chamber 11 is connected to an exhaust unit 24 through an exhaust line 23.

The chamber 1 is provided with a worktable 2 disposed therein and made of a ceramic with a high thermal conductivity, such as AlN, for supporting a target substrate, such as a silicon wafer (which will be simply referred to as "wafer", hereinafter) W, in a horizontal state. The worktable 2 is supported by a cylindrical support member 3 made of a ceramic, such as AlN, and extending upward from the center of the bottom of the exhaust chamber 11. The worktable 2 is provided with a cover ring 4 covering the outer edge of the worktable 2 and configured to guide the wafer W. The cover ring 4 is made of a dielectric material, such as quartz, AlN, $Al_2O_3$, or SiN.

The worktable 2 is provided with a heater 5 of the resistance heating type embedded therein. The heater 5 is supplied with a power from a heater power supply 5a to heat the worktable 2, thereby uniformly heating the target substrate or wafer W. Further, a thermocouple 6 is connected to the worktable 2, so that heating temperature for the wafer W can be controlled within a range of, e.g., from room temperature to 900° C. The worktable 2 is provided with wafer support pins (not shown) that can project and retreat relative to the surface of the worktable 2 to support the wafer W and move it up and down.

The inner wall of the chamber 1 is covered with a cylindrical quartz liner 7 to prevent metal contamination due to the construction material of the chamber. An annular baffle plate 8 is disposed around the worktable 2 to uniformly exhaust gas from inside the chamber 1. The baffle plate 8 is supported by a plurality of support rods 9.

A gas feed member 15 having an annular structure is attached in the sidewall of the chamber 1, and is connected to a gas supply system 16. The gas feed member may have a nozzle or shower structure. For example, the gas supply system 16 includes an Ar gas supply source 17, an $O_2$ gas supply source 18, and an $H_2$ gas supply source 19, from which Ar gas, $O_2$ gas, and $H_2$ gas are supplied through respective gas lines 20 to the gas feed member 15 and are delivered from the gas feed member 15 into the chamber 1. Each of the gas lines 20 is provided with a mass-flow controller 21 and two switching valves 22 one on either side of the controller 21. In place of Ar gas, another rare gas, such as Kr gas, Xe gas, or He gas, may be used.

The sidewall of the exhaust chamber 11 is connected to an exhaust unit 24 including a high speed vacuum pump through an exhaust line 23. The exhaust unit 24 can be operated to uniformly exhaust gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma processing apparatus 100 and an adjacent transfer chamber (not shown) through the transfer port 25.

The top of the chamber 1 is opened and connected to an annular upper plate 27 formed along the opening. The lower side of the inner periphery of the upper plate 27 projects inward into the space inside the chamber and forms an annular support portion 27a. A microwave transmission plate 28 is airtightly mounted on the support portion 27a through a seal member 29. The microwave transmission plate 28 is made of a dielectric material, such as quartz or a ceramic, e.g., $Al_2O_3$ or AlN, to transmit microwaves. The interior of the chamber 1 is thus held airtight.

A circular planar antenna member 31 is disposed above the transmission plate 28 to face the worktable 2. The planar antenna member 31 may be formed of a rectangular plate in place of the circular plate. The planar antenna member 31 is fixed to the top of the sidewall of the chamber 1. The planar antenna member 31 is formed of, e.g., a copper plate or aluminum plate with the surface plated with gold or silver. The planar antenna member 31 has a number of slot-like microwave radiation holes 32 for radiating microwaves, formed therethrough and arrayed in a predetermined pattern.

Figure 2:
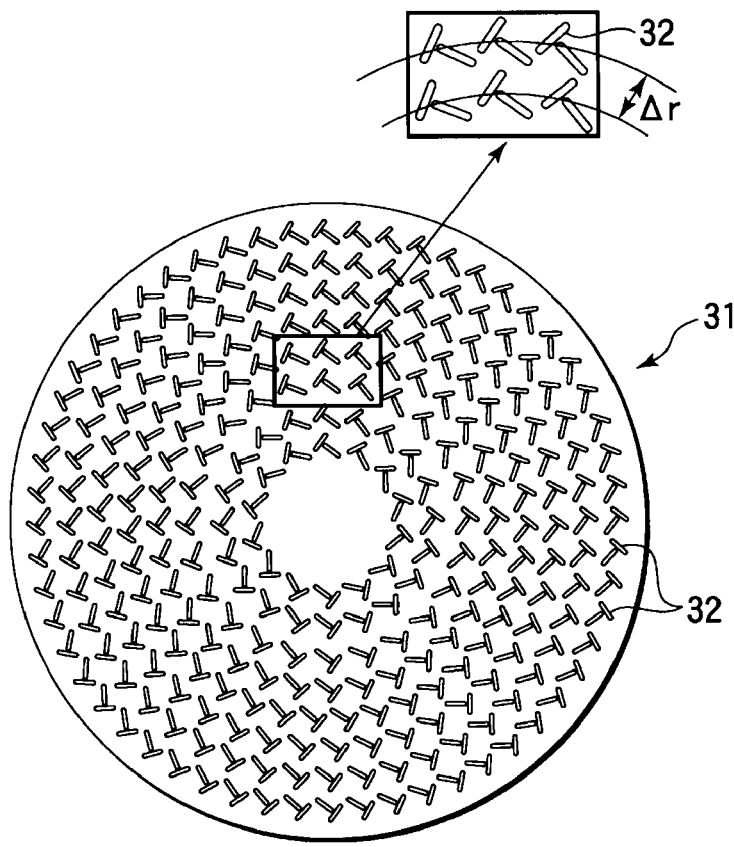
FIG. 2 This is a view showing the structure of a planar antenna member.

For example, as shown in FIG. 2, the microwave radiation holes 32 are formed of long slits, wherein the microwave radiation holes 32 are typically arranged such that adjacent microwave radiation holes 32 form a T-shape, and they are arrayed on a plurality of concentric circles. The length and array intervals of the microwave radiation holes 32 are determined in accordance with the wavelength ($\lambda g$) of microwaves. For example, the intervals of the microwave radiation holes 32 are set to be $\lambda g/4$, $\lambda g/2$, or $\lambda g$. In FIG. 2, the interval between adjacent microwave radiation holes 32 respectively on two concentric circles is expressed with $\Delta r$. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 having a dielectric constant larger than that of vacuum is located on the top of the planar antenna member 31. The wave-retardation body 33 shortens the wavelength of microwaves to adjust plasma, because the wavelength of microwaves becomes longer in a vacuum condition. The planar antenna member 31 may be set in contact with or separated from the transmission plate 28. Similarly, the wave-retardation body 33 may be set in contact with or separated from the planar antenna member 31. However, these members are preferably set in contact with the adjacent one.

The planar antenna member 31 and wave-retardation body 33 are covered with the shield lid 34 located at the top of the chamber 1 and made of a metal material, such as aluminum or stainless steel. A seal member 35 is interposed between the top of the chamber 1 and the shield lid 34 to seal this portion. The shield lid 34 is provided with a plurality of cooling water passages 34a formed therein. Cooling water is supplied to flow through the cooling water passages and thereby cool the shield lid 34, wave-retardation body 33, planar antenna member 31, and transmission plate 28. The shield lid 34 is grounded.

The shield lid 34 has an opening 36 formed at the center of the upper wall and connected to a waveguide tube 37. The waveguide tube 37 is connected to a microwave generation unit 39 for generating microwaves at one end through a matching circuit 38. The microwave generation unit 39 generates microwaves with a frequency of, e.g., 2.45 GHz, which are transmitted through the waveguide tube 37 to the planar antenna member 31. The microwaves may have a frequency of 8.35 GHz or 1.98 GHz.

The waveguide tube 37 includes a coaxial waveguide tube 37a having a circular cross-section and extending upward from the opening 36 of the shield lid 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then turned into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna member 31 at the lower end. Consequently, microwaves are efficiently and uniformly propagated from the inner conductive body 41 of the coaxial waveguide tube 37a in the radial direction to the planar antenna member 31.

The respective components of the plasma processing apparatus 100 are connected to and controlled by a process controller 50 comprising a CPU. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

The plasma processing apparatus 100 structured as described above can proceed with a plasma process at a low temperature of 800° C. or less and to be free from damage on underlying films and so forth. Further, the apparatus 100 can provide good plasma uniformity to realize a uniform process.

Figure 3:
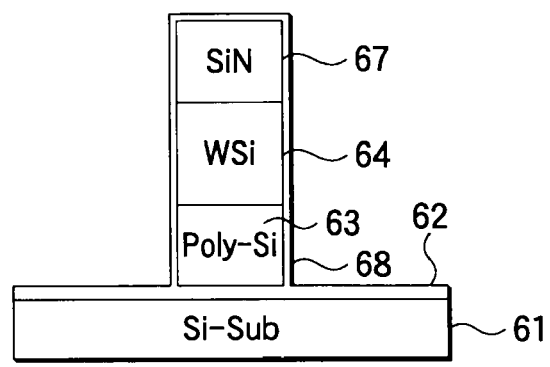
FIG. 3 This is a view schematically showing the structure of a gate electrode.

For example, the plasma processing apparatus 100 is suitably usable for an oxidation process of the poly-silicon layer of a gate electrode, as described above. As regards gate electrodes, owing to the demands for higher integration degrees and higher operation speeds of LSIs, design rules have been miniaturized, so sidewall oxidation of gate electrodes is required to be controlled more accurately, and the resistivity of gate electrodes is required to be lower. For this reason, a gate having a tungsten polycide structure as shown in FIG. 3 is used, wherein a poly-silicon layer 63 is formed on an Si substrate 61 through a gate insulating film 62 and a tungsten silicide (WSi) layer 64 is formed as a metal-containing layer on the poly-silicon layer 63. In place of tungsten, the metal-containing layer may contain another refractory metal, such as molybdenum, tantalum, or titanium. A metal other than refractory metals may be used. Further, a gate electrode may include a film made of such a metal, or silicide, nitride, or alloy thereof.

In FIG. 3, a reference symbol 67 denotes a hard mask layer made of an insulating film, such as silicon nitride (SiN), and used in etching the gate electrode, and a reference symbol 68 denotes a silicon oxide film formed by selective oxidation.

Figure 4A:
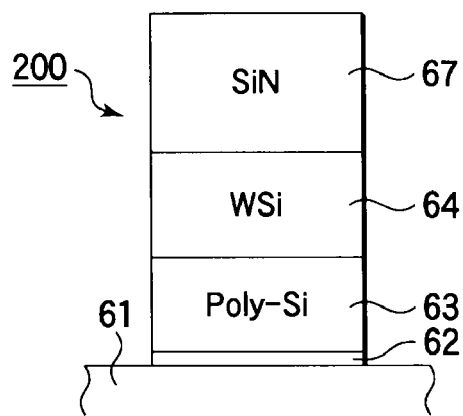
FIG. 4A This is a view schematically showing the gate electrode before a plasma oxidation sequence.
Figure 4B:
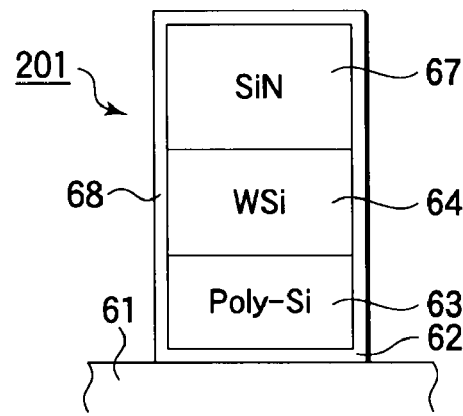
FIG. 4B This is a view schematically showing the gate electrode after a first oxidation process.
Figure 4C:
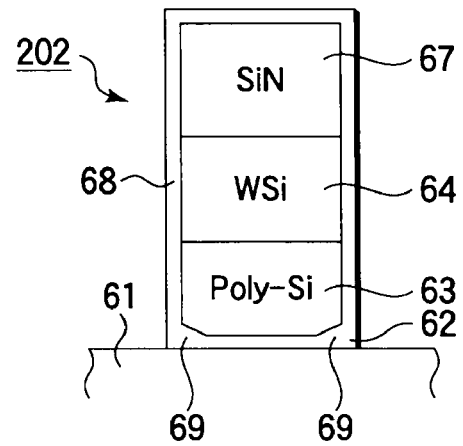
FIG. 4C This is a view schematically showing the gate electrode after a second oxidation process.

Next, an explanation will be given of steps for manufacturing a semiconductor device by a method according to the present invention. As an example, this explanation takes the gate electrode of a semiconductor device of the MOS type (a field effect transistor of the MOS type). FIGS. 4A to 4C schematically show a manner of a silicon oxide film 68 being formed on a tungsten polycide structure including a tungsten silicide layer 64. FIG. 4A shows a gate electrode 200 after etching. A reference symbol 61 denotes an Si substrate.

In a fabrication sequence of the gate electrode 200, at first, a $P^+$- or $N^+$-well region (diffusion region (not shown)) doped with a p-type impurity or n-type impurity is formed in the Si substrate 61. Then, a gate insulating film 62 ($SiO_2$ film) is formed by a thermal oxidation process or the like. A poly-silicon film is deposited on the gate insulating film 62 by CVD to form a poly-silicon layer 63. Further, a tungsten silicide layer 64, which is a high-melting point electrode material, is formed on the poly-silicon layer 63 to decrease the resistivity of the gate electrode 200 to improve the operation speed. For example, the tungsten silicide layer 64 may be formed by directly deposit the tungsten silicide layer 64 by a CVD method. Alternatively, the tungsten silicide layer 64 may be formed by forming a tungsten film by a sputtering method and then turning it into the tungsten silicide layer 64 by a thermal annealing process or the like.

A hard mask layer 67 of silicon nitride and a photo-resist film (not shown) are formed in this order on the tungsten silicide layer 64.

Thereafter, the hard mask layer 67 is etched by photolithography using the photo-resist film as a mask. Further, using the photo-resist film and hard mask layer 67 or the hard mask layer 67 as a mask, the tungsten silicide layer 64 and poly-silicon layer 63 are sequentially etched to form the gate electrode 200. By this series of etching processes, sidewalls of the poly-silicon layer 63 and tungsten silicide layer 64 are exposed on the side surface of the gate electrode 200. Further, a part of the gate insulating film 62 has been removed by etching.

Figure 5:
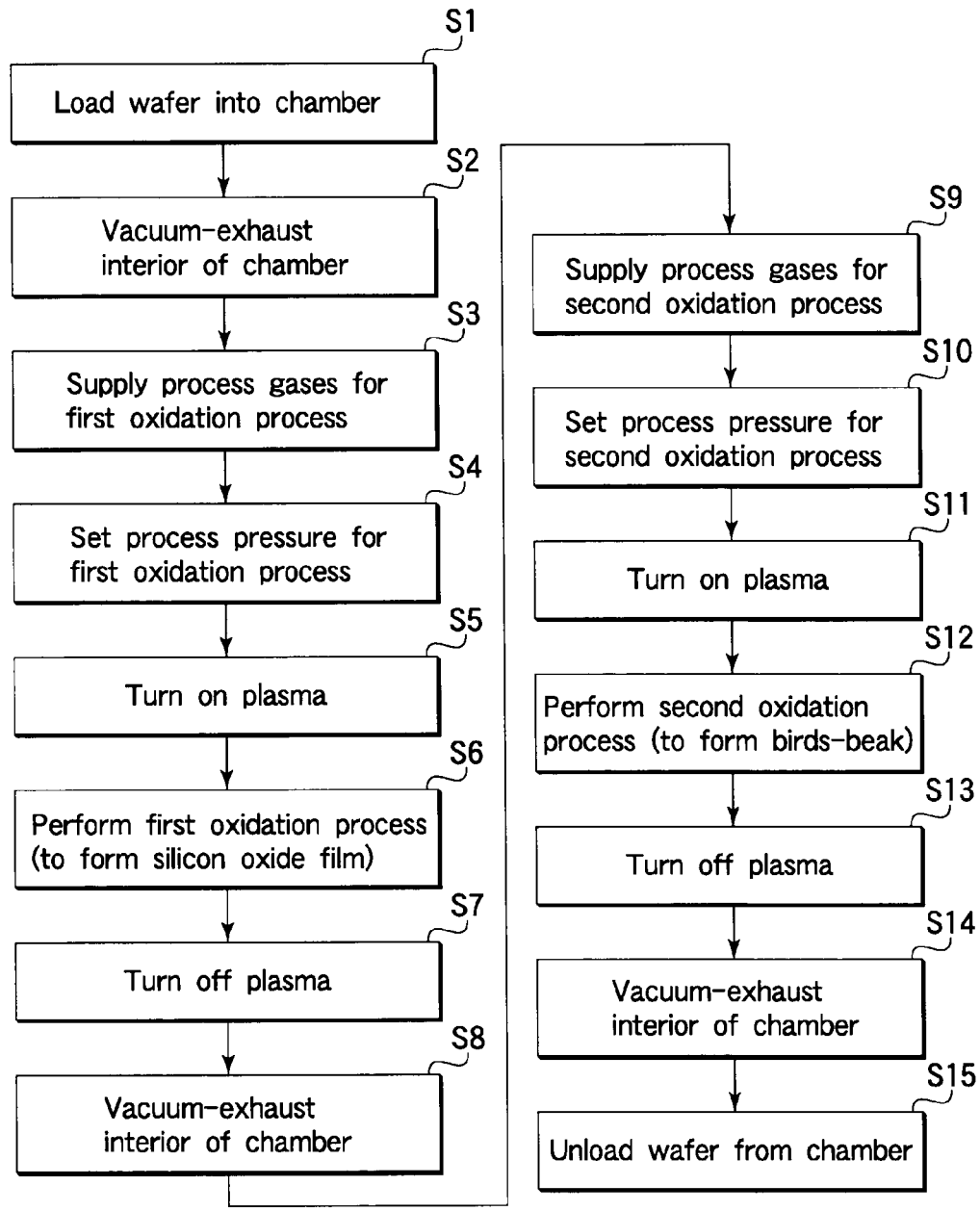
FIG. 5 This is a flow chart showing main steps of the plasma oxidation sequence.

Thereafter, in the plasma processing apparatus 100, a first oxidation process and a second oxidation process are preformed by use of different process pressures, on the gate electrode 200 thus formed. FIG. 5 shows main steps of the plasma oxidation sequence.

At first, the gate valve 26 is opened, and a wafer W having the gate electrode 200 formed thereon is loaded through the transfer port 25 into the chamber 1 and placed on the worktable 2 (step S1). Then, the first oxidation process is performed. In the first oxidation process, the interior of the chamber 1 is vacuum-exhausted (step S2), and Ar gas, $H_2$ gas, and $O_2$ gas are supplied at predetermined flow rates from the Ar gas supply source 17, $O_2$ gas supply source 18, and $H_2$ gas supply source 19 in the gas supply system 16 through the gas feed member 15 into the chamber 1 (step S3). As regards conditions used at this time, the flow rate is preferably set such that, e.g., Ar gas: 0 to 2,000 mL/min (sccm), $H_2$ gas: 10 to 500 mL/min (sccm), and $O_2$ gas: 10 to 500 mL/min (sccm). The flow rate ratio ($H_2/O_2$) between $H_2$ and $O_2$ is preferably set to be 1 or more and more preferably to be 2 or more, such as 2 to 8. Where the amount of $H_2$ is set to be larger than the amount of $O_2$, the oxidation process can be controlled to be optimum to the plurality of films.

Then, the interior of the chamber 1 is set at the process pressure of the first oxidation process (step S4). In order to inhibit oxidation of tungsten and to oxidize only silicon in the tungsten silicide layer 64, so as to form an oxide film on the surface of the tungsten silicide layer 64, the pressure inside the chamber is preferably set to be 1.33 to 66.67 Pa and more preferably to be 1.33 to 6.67 Pa. For the same purpose, the process temperature (defined by the wafer temperature) is preferably set to be 250 to 800° C., and more preferably to be 300 to 500° C.

Then, microwaves are supplied from the microwave generation unit 39 through the matching circuit 38 into the waveguide tube 37. At this time, the microwave power is preferably set to be 1,000 to 4,000 W. The microwaves are supplied through the rectangular waveguide tube 37b, mode transducer 40, and coaxial waveguide tube 37a in this order to the planar antenna member 31. Then, the microwaves are radiated from the planar antenna member 31 through the microwave transmission plate 28 into the space above the wafer W within the chamber 1. The microwaves are propagated in a TE mode through the rectangular waveguide tube 37b, and are then turned from the TE mode into a TEM mode by the mode transducer 40 and propagated in the TEM mode through the coaxial waveguide tube 37a to the planar antenna member 31.

When the microwaves are radiated from the microwave radiation holes 32 of the planar antenna member 31 through the microwave transmission plate 28 into the chamber 1, an electromagnetic field is formed inside the chamber 1, and $H_2$ gas, Ar gas, and $O_2$ gas are thereby turned into plasma (step S5). With this plasma, the sidewall of the poly-silicon layer 63 exposed on the gate electrode 200 on the wafer W is preferentially oxidized, and a silicon oxide film is thereby formed (step S6). Since microwaves are radiated from a number of microwave radiation holes 32 of the planar antenna member 31, this microwave plasma has a high plasma density of about $1 \times 10^{10}$ to $5 \times 10^{12}/cm^3$, an electron temperature of about 0.7 to 2 eV, and a plasma density uniformity of ±5% or less. Accordingly, the surface of the poly-silicon layer 63 can be preferentially oxidized at a low temperature and in a short time to form the silicon oxide film 68. Further, this plasma has a merit such that underlying films can suffer less plasma damage due to ions and so forth. Consequently, as shown in FIG. 4B, the silicon oxide film ($SiO_2$ film) 68 can be preferentially formed on the exposed surface of the poly-silicon layer 63, while inhibiting oxidation of tungsten in the tungsten silicide layer 64.

As described above, the oxidation process is performed on the surface of the poly-silicon layer 63 in a short time at a low temperature by use of such high density plasma of a gas containing $H_2$. In this case, the process can be performed with high accuracy, while formation of $WO_x$ ($WO_3$, $WO_2$, or WO) due to oxidation of tungsten (W) is suppressed as far as possible.

It is thought that hydrogen contained in the process gas inhibits oxidation of tungsten by a mechanism relying on reactions expressed by the following formulas (1) and (2).

Specifically, where the process gas is $Ar/O_2$, the reaction of the formula (1) solely takes place and $WO_3$ is generated due to oxidation of tungsten. On the other hand, where the process gas is $Ar/O_2/H_2$, the reaction of the formula (2) also takes place, and so $WO_3$ generated by the formula (1) reacts with H* and is reduced by this reaction. Consequently, the reactions proceed to generate tungsten and thereby suppress oxidation of tungsten.

As described above, where the process is performed by use of a low pressure condition, a thin silicon oxide film ($SiO_2$ film) is formed on the surface of the tungsten silicide layer 64, while silicon in the tungsten silicide layer 64 is preferentially oxidized, as indicted by the gate electrode 201 shown in FIG. 4B.

Specifically, in the low pressure process described above, the $H_2/O_2$ ratio is set to be 1 or more, and preferably to be 2 to 8, so that oxidation rate of silicon becomes higher than the oxidation rate of a metal, such as tungsten, and the silicon oxidation selectivity is thereby increased. Consequently, as shown in FIG. 4B, the silicon oxide film 68 is formed not only on the surface of the poly-silicon layer 63 but also on the surface of the tungsten silicide layer 64 (and hard mask layer 67). The silicon oxide film 68 formed on the surface of the tungsten silicide layer 64 serves as a protection film that inhibits oxidation of tungsten (W) in the tungsten silicide layer 64 during the second oxidation process subsequently performed.

After the plasma oxidation process is performed until the silicon oxide film 68 comes to have a predetermined film thickness, the microwave power is turned off (OFF) to finish the first oxidation process (step S7).

After the first oxidation process, the second oxidation process is conducted to perform an oxidation process by use of a high pressure condition, so that a birds-beak shaped portion is formed at either end of the gate oxide film.

At first, the interior of the chamber 1 is vacuum-exhausted (step S8), and Ar gas, $H_2$ gas, and $O_2$ gas are supplied at predetermined flow rates from the Ar gas supply source 17, $O_2$ gas supply source 18, and $H_2$ gas supply source 19 in the gas supply system 16 through the gas feed member 15 into the chamber 1 (step S9). Then, the interior of the chamber 1 is set at a predetermined pressure (step S10). In the second oxidation process, an oxidation process is performed by use of a higher pressure than the process pressure of the first oxidation process.

As regards conditions used for the second oxidation process, the pressure inside the chamber is preferably set at a higher pressure of 133.3 to 1,333 Pa, and more preferably of 266.6 to 666.5 Pa. The process temperature (defined by the wafer temperature) is preferably set to be 250 to 800° C., and more preferably to be 300 to 500° C. As regards other conditions, the flow rate is preferably set such that, e.g., Ar gas: 0 to 2,000 mL/min (sccm), $H_2$ gas: 10 to 500 mL/min (sccm), and $O_2$ gas: 10 to 500 mL/min (sccm). The flow rate ratio ($H_2/O_2$) between $H_2$ and $O_2$ is preferably set to be 1 or more and more preferably to be 2 or more, such as 2 to 8.

The second oxidation process may be performed subsequently to the first oxidation process inside the same chamber of the plasma processing apparatus 100. However, the second oxidation process may be performed in a plasma processing apparatus other than that used for the first oxidation process.

Then, microwaves are supplied from the microwave generation unit 39 through the matching circuit 38 into the waveguide tube 37. At this time, the microwave power is preferably set to be 100 to 4,000 W. As in the first oxidation process, the microwaves are radiated from the planar antenna member 31 through the microwave transmission plate 28 into the chamber 1. Consequently, an electromagnetic field is formed inside the chamber 1, and H$_2$ gas, Ar gas, and O$_2$ gas are thereby turned into plasma (step S11). This plasma further develops oxidation in which, since an oxidation process is performed by use of a higher pressure than that of the first oxidation process, the lower edge portions of the poly-silicon layer 63 are further oxidized and a moderate birds-beak shaped portion 69 is thereby formed at either end of the gate oxide film (step S12). Further, with this plasma oxidation process, the silicon oxide film 68 increases its film thickness to some extent. Consequently, the gate electrode 202 is changed to a state shown in FIG. 4C.

As described above, the silicon oxide film 68 has also been preferentially formed on the surface of the tungsten silicide layer 64 by the first oxidation process, and this silicon oxide film 68 serves as a protection film that inhibits oxidation of tungsten (W) in the tungsten silicide layer 64 during the second oxidation process. Since oxidation of tungsten in the tungsten silicide layer 64 (formation of oxide WO$_x$ to be scattered) is suppressed, particle contamination on the wafer W and expansion of the tungsten silicide layer 64 due to this oxidation are prevented. Consequently, the reliability of semiconductor devices using this gate electrode 202 is ensured. Further, particle contamination inside the process chamber 1 is also suppressed.

After the plasma oxidation process is performed until the silicon oxide film 68 comes to have a predetermined film thickness, the microwave power is turned off (OFF) to finish the second oxidation process (step S13). Thereafter, the interior of the chamber 1 is vacuum-exhausted (step S14), the gate valve 26 is opened, and the wafer W is unloaded through the transfer port 25 (step S15). Thus the process sequence on one wafer W is completed.

Next, an explanation will be given of results of experiments conducted in the process of developing the present invention.

A gate electrode 200 having the structure shown in FIG. 4A was prepared, and sidewall oxidation for a poly-silicon layer 63 was performed thereon in the plasma processing apparatus 100 shown in FIG. 1, while different values of the process pressure were used. Specifically, the process pressure was set at a lower pressure of 6.7 Pa (50 mTorr) and a higher pressure of 400 Pa (3 Torr).

In the plasma oxidation process, Ar gas, O$_2$ gas, and H$_2$ gas were supplied as process gases at a flow rate ratio of Ar/O$_2$/H$_2$=1,000/100/200 mL/min (sccm). The process temperature was set at a preset temperature of 600° C. (a wafer temperature of 450° C.). The plasma application power was set at 3,400 W. The process time was set for the silicon oxide film 68 formed on the sidewall of the poly-silicon layer 63 to have a film thickness of 10 nm.

Figure 6A:
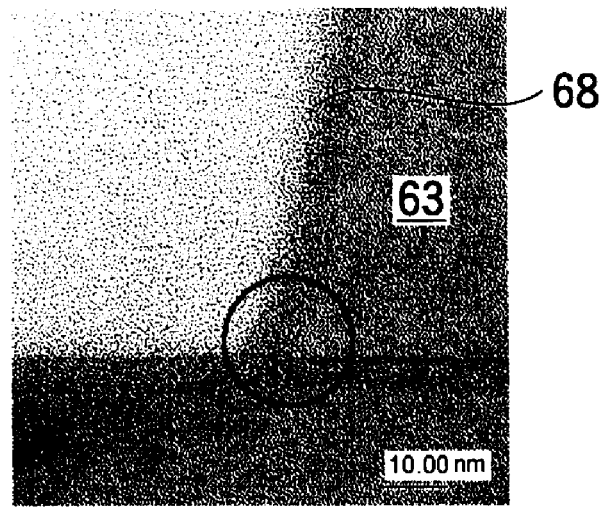
FIG. 6A This is a view of a TEM picture showing the shape of a lower edge portion of a poly-silicon layer in a gate electrode where the gate electrode was processed at 6.7 Pa.
Figure 6B:
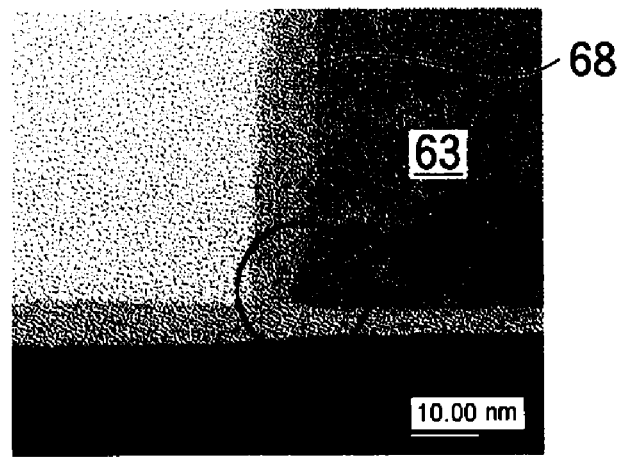
FIG. 6B This is a view of a TEM picture showing the shape of a lower edge portion of a poly-silicon layer in a gate electrode where the gate electrode was processed at 400 Pa.

Before and after the plasma oxidation process, the shape of the lower edge portions of the poly-silicon layer 63 was observed by a TEM (transmission electron microscope). Consequently, as shown in FIG. 6A, where the lower pressure condition (6.7 Pa) was used, it was confirmed that oxidation did not proceed at the edge portions (e.g., a portion surrounded by a circle) to provide formation of a birds-beak shaped portion. On the other hand, as shown in FIG. 6B, where the higher pressure condition (400 Pa) was used, it was confirmed that oxidation proceeded at the edge portions (e.g., a portion surrounded by a circle) to provide formation of a birds-beak shaped portion.

Then, a wafer of a silicon substrate with a tungsten layer formed thereon was prepared, and a plasma oxidation process was performed thereon in the plasma processing apparatus 100, while different values of the process pressure were used. Specifically, the process pressure was set at 6.7 Pa (50 mTorr) and 400 Pa (3 Torr). In the plasma oxidation process, Ar gas, O$_2$ gas, and H$_2$ gas were supplied as process gases at a flow rate ratio of Ar/O$_2$/H$_2$=1,000/100/200 mL/min (sccm). The process temperature was set at a preset temperature of 600° C. (a wafer temperature of 450° C.). The plasma application power was set at 3,400 W. The process time was set for the silicon oxide film 68 formed on the sidewall of the poly-silicon layer 63 to have a film thickness of 10 nm.

Figure 7:
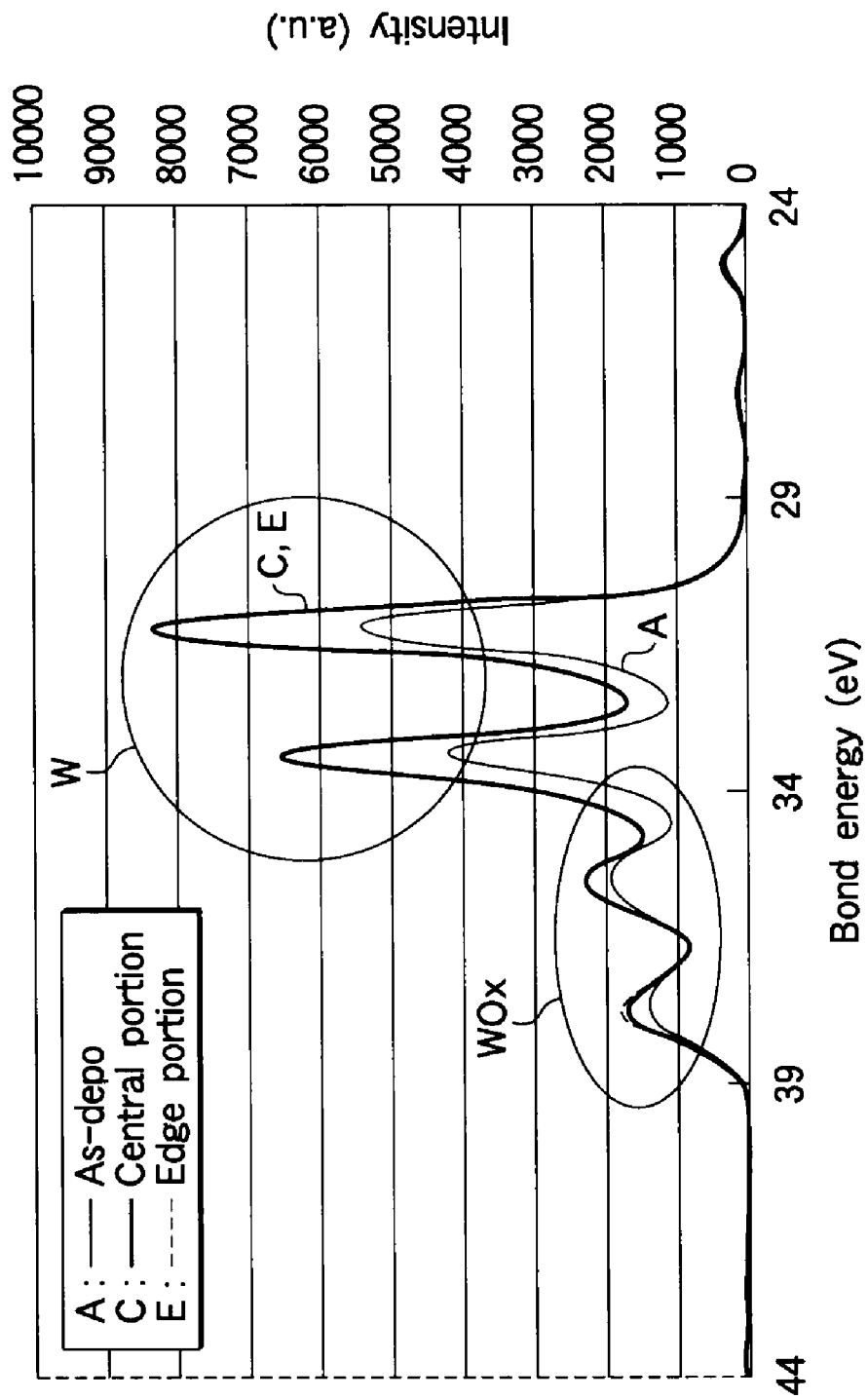
FIG. 7 This is a graph showing the 2p-spectrum of tungsten measured by a surface analysis using an XPS apparatus.
Figure 8:
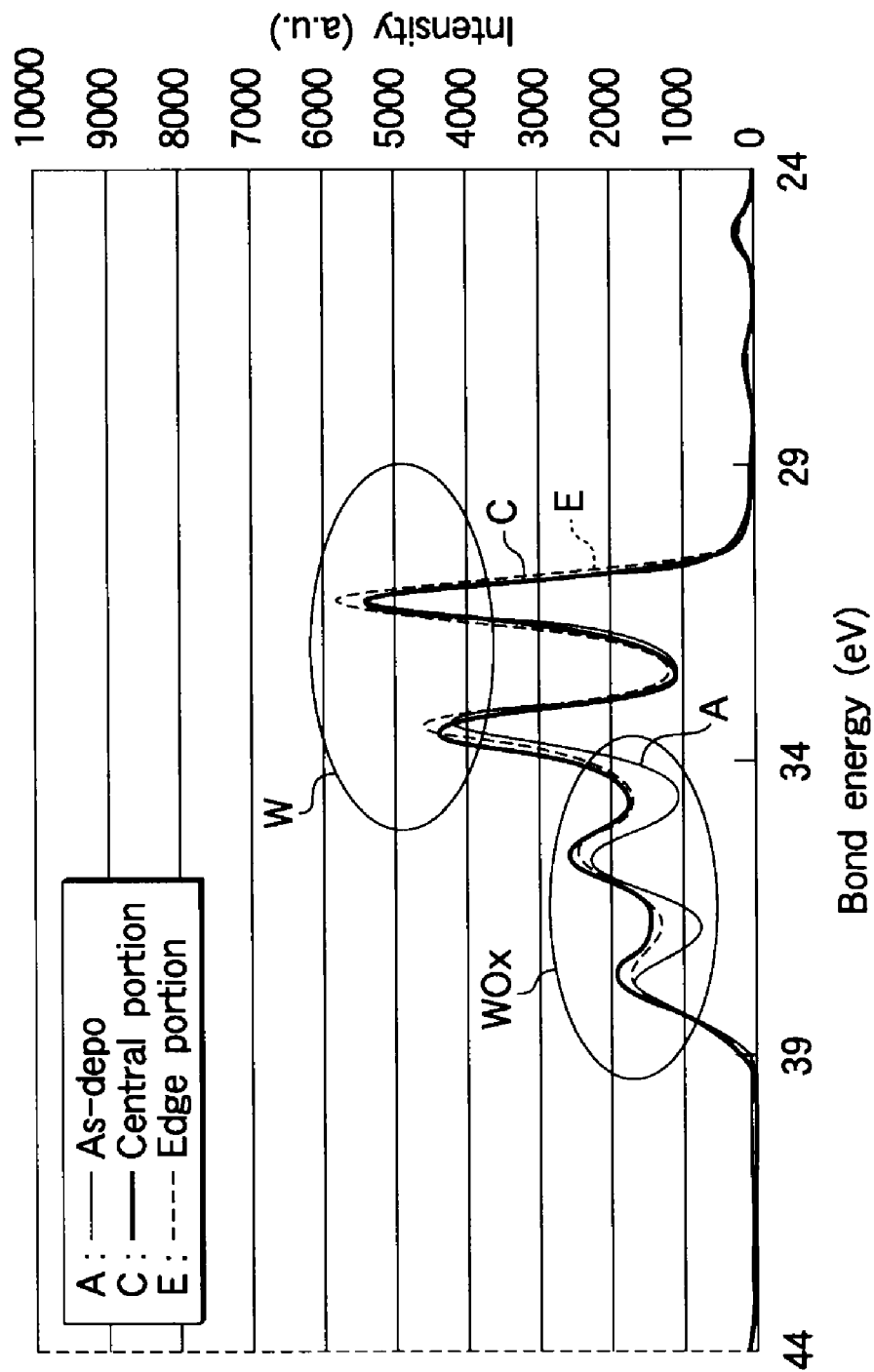
FIG. 8 This is a graph showing the 2p-spectrum of tungsten measured by a surface analysis using an XPS apparatus.

FIGS. 7 and 8 show results from a surface analysis performed by use of an XPS analysis apparatus (X-Ray Photoelectron Spectroscopy Analysis) on the tungsten layer, at the center (central portion) and edge (edge portion) of the blanket wafer, before and after the plasma process. FIG. 7 shows a result obtained where the process pressure of the plasma oxidation process was set at 6.7 Pa (50 mTorr). FIG. 8 shows a result obtained where the process pressure of the plasma oxidation process was set at 400 Pa (3 Torr). In FIGS. 7 and 8, a curved line A denotes a measurement result of "As depo" (unprocessed; no oxidation was performed thereon), a curved line C denotes a measurement result at the central portion after the plasma process, and a curved line E denotes a measurement result at the edge portion after the plasma process.

As can be seen from comparison of FIGS. 7 and 8 with each other, where the lower pressure condition (FIG. 7; 6.7 Pa) was used, it was confirmed that the peak of tungsten (W) after the plasma process was larger than that of "As depo", because oxidation of tungsten was suppressed due to reduction. On the other hand, where the higher pressure condition (FIG. 8; 400 Pa) was used, it was confirmed that the peak of WO$_x$ was larger than that of "As depo", because the tungsten was oxidized due to insufficient reduction as compared to the lower pressure condition (6.7 Pa).

On the basis of the results of the basic experiments described above, it has been found that, in order to form a birds-beak shaped portion in the oxide film at the edge portions of the poly-silicon layer 63, in the plasma processing apparatus 1, the plasma oxidation process is preferably performed by use of the higher pressure condition (400 Pa) rather than the lower pressure condition (6.7 Pa). Further, since oxidation of tungsten (W) can hardly proceed under the lower pressure condition (6.7 Pa), this condition is suitable for oxidizing only silicon while inhibiting oxidation of tungsten contained in the tungsten silicide layer 64, for example. Accordingly, it is estimated that a combination of an oxidation process at a lower pressure condition (1.33 to 66.67 Pa) and an oxidation process at a higher pressure condition (133.3 to 1,333 Pa) can realize formation of a moderate birds-beak shaped portion at the edge portions of the gate oxide film 62 below the poly-silicon layer 63, while inhibiting oxidation of tungsten in the tungsten silicide layer 64.

Next, an explanation will be given of results of experiments conducted to confirm effects of the present invention.

A flash memory device was prepared, and a sequence comprising two plasma oxidation processes using different process pressures was performed thereon in the plasma processing apparatus 100 shown in FIG. 1.

Figure 9A:
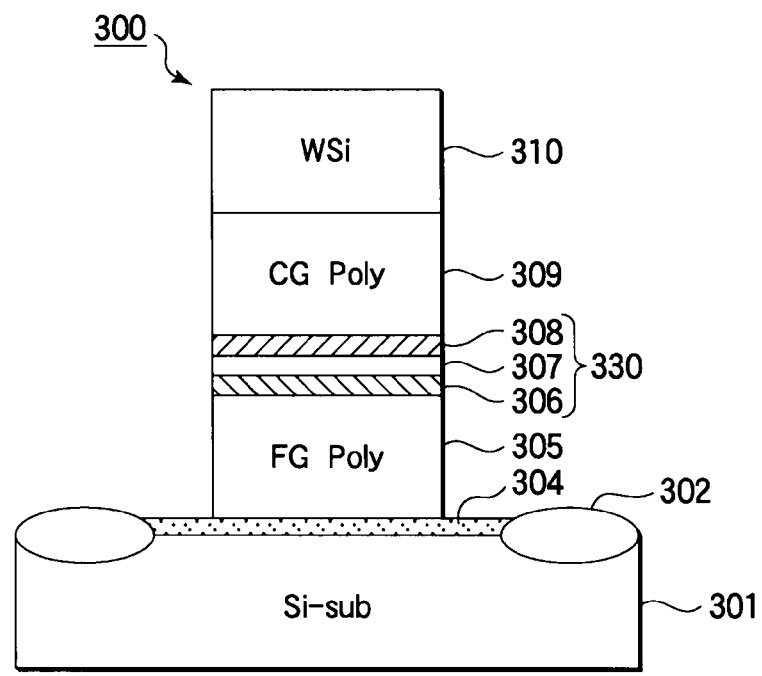
FIG. 9A This is a view schematically showing the structure of a flash memory device.

In this experiment, the plasma oxidation processes were performed on a flash memory device 300 having the structure shown in FIG. 9A.

Specifically, a silicon substrate 301 was provided with a memory cell region surrounded by a LOCOS oxide film 302, in which a tunnel oxide film 304 was formed to have a predetermined film thickness, and a first poly-silicon layer 305 (FG Poly) used as a floating gate was formed on the tunnel oxide film 304. A first silicon oxide film 306, a nitride film 307, and a second silicon oxide film 308 were formed in this order on the first poly-silicon layer 305 to constitute an insulating film of the so-called ONO laminated structure (ONO laminated film 330). A second poly-silicon layer 309 (CG Poly) used as a control gate and a tungsten silicide layer 310 (WSi) were formed on the ONO laminated film 330. Further, an etching stopper layer (not shown) made of, e.g., SiN was formed on the tungsten silicide layer 310 (WSi). The side surfaces of the first poly-silicon layer 305 (FG Poly), second poly-silicon layer 309 (CG Poly), and tungsten silicide layer 310 (WSi) were exposed by etching or the like.

Then, the silicon substrate 301 having the structure described above with exposed poly-silicon and tungsten silicide was loaded into the chamber 1. Then, a first oxidation process was performed inside the chamber 1 at a process pressure of 6.7 Pa (50 mTorr), i.e., by use of a lower pressure condition. At this time, Ar, $O_2$, and $H_2$ were supplied as process gases at a flow rate ratio of Ar/$O_2$/$H_2$=1,000/100/200 mL/min (sccm). The process temperature was set at a preset temperature of 800° C. (a wafer temperature of 650° C.). The plasma application power was set at 3.4 kW. The process time was set for an oxide film formed on the silicon substrate 301 to have a film thickness of 4 nm.

After the first oxidation process, a second oxidation process was performed inside the chamber 1 at a process pressure of 400 Pa (3 Torr), i.e., by use of a higher pressure condition. At this time, Ar, $O_2$, and $H_2$ were supplied as process gases at a flow rate ratio of Ar/$O_2$/$H_2$=1,000/100/200 mL/min (sccm). The process temperature was set at a preset temperature of 800° C. (a wafer temperature of 650° C.). The plasma application power was set at 3.4 kW. The process time was set for an oxide film formed on the silicon substrate 301 to have a film thickness of 8 nm. Consequently, a silicon oxide film was preferentially formed on the exposed surfaces of the first poly-silicon layer 305 (FG Poly), second poly-silicon layer 309 (CG Poly), and tungsten silicide layer 310 (WSi).

Figure 10:
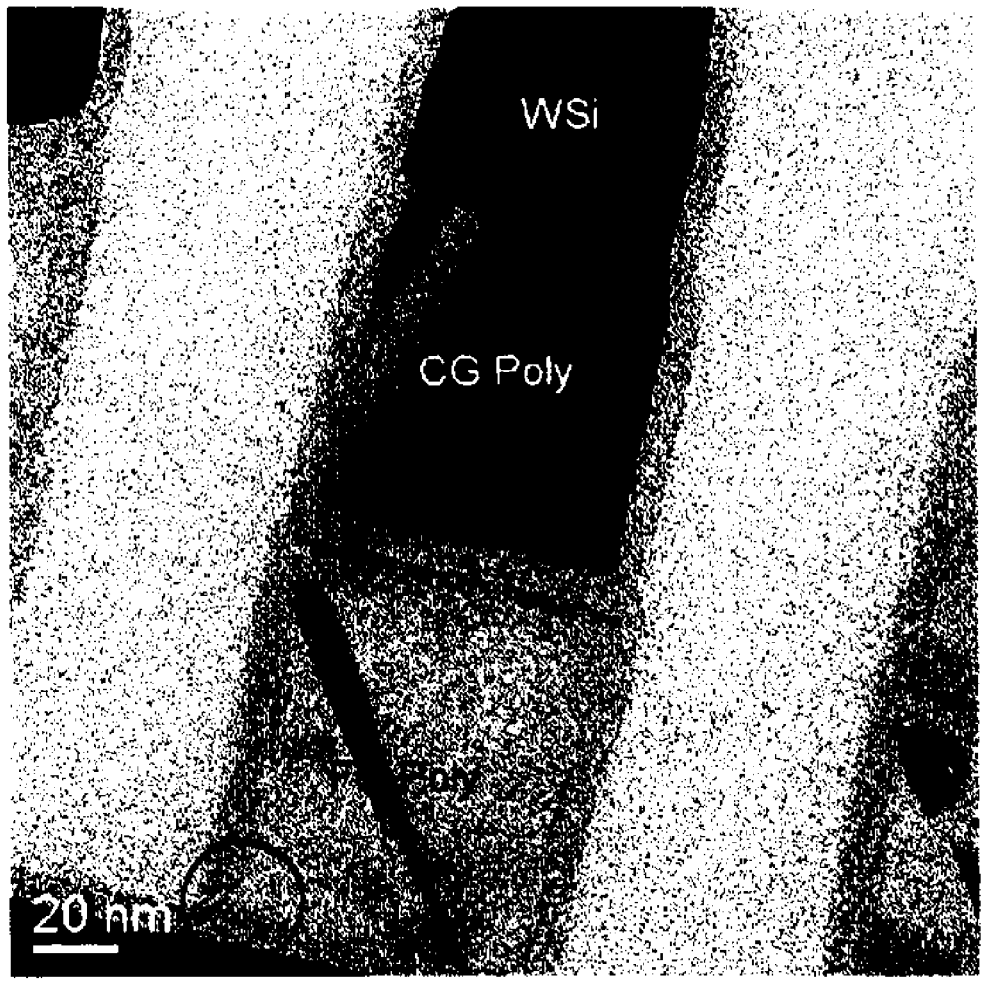
FIG. 10 This is a view of a TEM picture showing a state of the flash memory device after the oxidation sequence.

The flash memory device 300 thus processed by the plasma oxidation processes was observed by a TEM (transmission electron microscope). FIG. 10 shows a result of this experiment. As shown in FIG. 10, it was confirmed that a silicon oxide film was formed with an essentially uniform thickness on the sidewall of the first poly-silicon layer 305 (FG Poly) used as a floating gate, the second poly-silicon layer 309 (CG Poly) used as a control gate, and the tungsten silicide layer 310 (WSi). There was observed no expansion of the tungsten silicide layer 310 (WSi), i.e., oxidation of tungsten (W) was suppressed.

It was observed that oxidation proceeded at the edge portions (e.g., a portion surrounded by a circle in FIG. 10) on the lower side of the first poly-silicon layer 305 (FG Poly) to provide formation of a birds-beak shaped portion. Accordingly, it has been confirmed that, where a sequence comprising two plasma oxidation processes respectively using a lower pressure condition and a higher pressure condition is performed, oxidation of a refractory metal, such as tungsten, is suppressed, so that particle generation and abnormal shaping are prevented. Further, a moderate birds-beak is formed at the edge portions of the poly-silicon layer, so that an increase in leakage current from the edge portions is prevented. Consequently, it is possible to manufacture flash memory devices with high reliability, while they can be miniaturized as well.

Figure 9B:
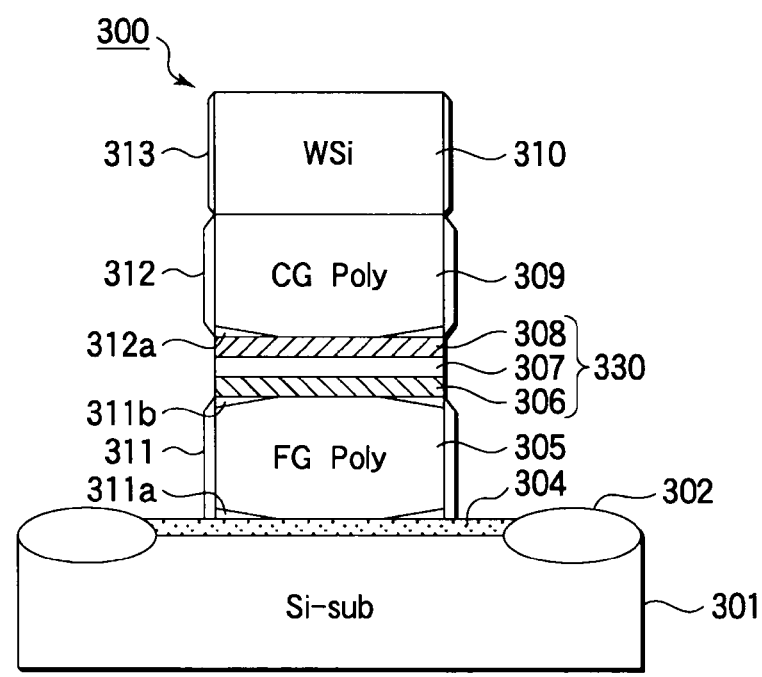
FIG. 9B This is a view schematically showing a state of the flash memory device of FIG. 9A after a plasma oxidation sequence.

FIG. 9B is a view schematically showing a state of the flash memory device 300 after the plasma oxidation sequence. Specifically, a silicon oxide film 311 having a uniform thickness was present on the sidewall of the first poly-silicon layer 305 (FG Poly) used as a floating gate. A silicon oxide film 312 having a uniform thickness was present on the sidewall of the second poly-silicon layer 309 (CG Poly) used as a control gate. A silicon oxide film 313 having a very thin but uniform thickness was present on the sidewall of the tungsten silicide layer 310 (WSi). Further, a birds-beak shaped portion 311a was present at the edge portions of the tunnel oxide film 304 below the first poly-silicon layer 305 (FG Poly). A birds-beak shaped portion 311b was present at the edge portions of the first silicon oxide film 306 above the first poly-silicon layer 305. Further, a birds-beak shaped portion 312a was present at the edge portions of the second silicon oxide film 308 below the second poly-silicon layer 309 (CG Poly) used as a control gate.

The present invention is not limited to an embodiment described above, and it may be modified in various manners. For example, in the embodiment described above, the present invention is applied to an oxidation sequence of a laminated structure including a poly-silicon layer and a tungsten silicide layer. However, in place of the tungsten silicide layer, a silicide layer of another refractory metal may be used, or a metal-containing layer other than silicide may be used. Further, in place of the poly-silicon layer, another silicon layer may be used. In the embodiment described above, the poly-silicon layer and tungsten silicide layer constitute a laminated structure, but they need not necessarily be laminated. Further, the plasma processing apparatus is exemplified by the RLSA type, but it may be selected from plasma processing apparatuses of various types, such as the ICP (inductively coupled plasma) type, surface wave plasma type, ECR plasma type, and magnetron type.

Further, in place of the transistor gate electrode and flash memory device, the present invention may be applied to manufacturing of various semiconductor devices that requires selective oxidation of a silicon-containing material while inhibiting oxidation of a metal in a metal silicide. Further, the semiconductor substrate is not limited to a silicon substrate, and it may be a compound semiconductor substrate. Further, in place of a semiconductor substrate, another substrate, such as a glass substrate for liquid crystal devices, may be processed.

The invention claimed is:

1. A plasma oxidation processing method for performing an oxidation process on a structural object including at least a silicon layer and a metal-containing layer, thereby forming a silicon oxide film on at least the silicon layer, the method comprising:

performing a first plasma oxidation process by use of a process gas including at least hydrogen gas and oxygen gas with the hydrogen gas larger in flow rate than the oxygen gas and a process pressure of 1.33 to 66.67 Pa, to oxidize a surface of the silicon layer to form a surface silicon oxide film thereon; and performing a second plasma oxidation process by use of a process gas including at least hydrogen gas and oxygen gas with the hydrogen gas larger in flow rate than the oxygen gas and a process pressure of 133.3 to 1,333 Pa, to further develop oxidation of the surface of the silicon layer and to oxidize an edge portion of the silicon layer to form a birds-beak shaped portion made of silicon oxide that extends inward from the surface silicon oxide film, after the first plasma oxidation process.

2. The plasma oxidation processing method according to claim 1, wherein the silicon layer and the metal-containing layer are a poly-silicon layer and a metal silicide layer, respectively, which are laminated to form a laminated structure as the structural object.

3. The plasma oxidation processing method according to claim 2, wherein the metal silicide layer is a tungsten silicide layer.

4. The plasma oxidation processing method according to claim 1, wherein the first and second plasma oxidation process is performed by use of a process temperature of 250 to 800° C.

5. The plasma oxidation processing method according to claim 1, wherein the metal-containing layer is a metal silicide layer, and the first plasma oxidation process is arranged to use process conditions for oxidizing silicon of the metal silicide layer at a surface thereof, to form a surface silicon oxide film on the surface of the meal silicide layer.

6. The plasma oxidation processing method according to claim 1, wherein the method is performed in a plasma processing apparatus including a planar antenna with a plurality of slots formed therein, by which microwaves are supplied into a process chamber to generate plasma.

7. A semiconductor device manufacturing method comprising:
    forming an insulating film on a semiconductor substrate;
    forming a laminated film including at least a poly-silicon layer and a metal-containing layer on the insulating film;
    performing an etching process on the laminated film, thereby forming a laminated structure of the poly-silicon layer and the metal-containing layer;
    performing a first plasma oxidation process on the laminated structure by use of a process gas including at least hydrogen gas and oxygen gas with the hydrogen gas larger in flow rate than the oxygen gas and a process pressure of 1.33 to 66.67 Pa, to oxidize a surface of the poly-silicon layer to form a surface silicon oxide film thereon; and
    performing a second plasma oxidation process by use of a process gas including at least hydrogen gas and oxygen gas with the hydrogen gas larger in flow rate than the oxygen gas and a process pressure of 133.3 to 1,333 Pa, to further develop oxidation of the surface of the poly-silicon layer and to oxidize an edge portion of the poly-silicon layer to form a birds-beak shaped portion made of silicon oxide that extends inward from the surface silicon oxide film, after the first plasma oxidation process.

8. The semiconductor device manufacturing method according to claim 7, wherein the metal-containing layer comprises at least one material selected from the group consisting of tungsten, molybdenum, tantalum, and titanium; silicides thereof; and alloys thereof.

9. The semiconductor device manufacturing method according to claim 8, wherein the metal-containing layer is a tungsten silicide layer.

10. The semiconductor device manufacturing method according to claim 7, wherein the first and second plasma oxidation process is performed by use of a process temperature of 250 to 800° C.

11. The semiconductor device manufacturing method according to claim 7, wherein the metal-containing layer is a metal silicide layer, and the first plasma oxidation process is arranged to use process conditions for oxidizing silicon of the metal silicide layer at a surface thereof, to form a surface silicon oxide film on the surface of the metal silicide layer.

12. The semiconductor device manufacturing method according to claim 7, wherein the semiconductor device is a MOS transistor.

13. The semiconductor device manufacturing method according to claim 7, wherein the semiconductor device is a flash memory device, the poly-silicon layer comprises a first poly-silicon layer disposed to serve as a floating gate electrode on the insulating film formed of a tunnel oxide film and a second poly-silicon layer disposed to serve as a control gate electrode above the floating gate electrode with another insulating film interposed therebetween, and said another insulating film has a laminated structure formed of an oxide film, a nitride film, and an oxide film sequentially laminated in this order from below.

14. A plasma oxidation processing method for performing an oxidation process on a substrate including an oxide film, a first poly-silicon layer, an insulating film, a second poly-silicon layer, and a metal-containing layer sequentially formed in this order from below, thereby forming a silicon oxide film on at least the first and second poly-silicon layers, the method comprising:
    performing a first plasma oxidation process by use of a process gas including at least hydrogen gas and oxygen gas with the hydrogen gas larger in flow rate than the oxygen gas and a process pressure of 1.33 to 66.67 Pa, to oxidize a surface of each of the first and second poly-silicon layers to form a surface silicon oxide film thereon; and
    performing a second plasma oxidation process by use of a process gas including at least hydrogen gas and oxygen gas with the hydrogen gas larger in flow rate than the oxygen gas and a process pressure of 133.3 to 1,333 Pa, to further develop oxidation of the surface of each of the first and second poly-silicon layers and to oxidize an edge portion of each of the first and second poly-silicon layers to form a birds-beak shaped portion made of silicon oxide that extends inward from the surface silicon oxide film, after the first plasma oxidation process.

15. The plasma oxidation processing method according to claim 14, wherein the metal-containing layer comprises at least one material selected from the group consisting of tungsten, molybdenum, tantalum, and titanium; silicides thereof; and alloys thereof.

16. The plasma oxidation processing method according to claim 14, wherein the first and second plasma oxidation process is performed by use of a process temperature of 250 to 800° C.

17. The plasma oxidation processing method according to claim 14, wherein the metal-containing layer is a metal silicide layer, and the first plasma oxidation process is arranged to use process conditions for oxidizing silicon of the metal silicide layer at a surface thereof, to form a surface silicon oxide film on the surface of the metal silicide layer.

18. A plasma processing apparatus comprising:
    a process chamber configured to be vacuum-exhausted and to process a target object by use of plasma, the target object comprising a structural object including at least a silicon layer and a metal-containing layer;
    a gas supply section configured to supply at least hydrogen gas and oxygen gas into the process chamber;
    a plasma generation mechanism configured to generate plasma inside the process chamber; and
    a control section configured to control an operation of the plasma processing apparatus,
    wherein the control section is preset to
    perform a first plasma oxidation process on the target object by setting a process pressure of 1.33 to 66.67 Pa inside the process chamber, supplying a process gas including hydrogen gas and oxygen gas with the hydrogen gas larger in flow rate than the oxygen gas from the gas supply section into the process chamber, and generating plasma by the plasma generation mechanism, to oxidize a surface of the silicon layer to form a surface silicon oxide film thereon, and then perform a second plasma oxidation process on the target object by setting a process pressure of 133.3 to 1,333 Pa inside the process chamber, supplying a process gas including hydrogen gas and oxygen gas with the hydrogen gas larger in flow rate than the oxygen gas from the gas supply section into the process chamber, and generating plasma by the plasma generation mechanism, to further develop oxidation of the surface of the silicon layer and to oxidize an edge portion of the silicon layer to form a birds-beak shaped portion made of silicon oxide that extends inward from the surface oxide film.

19. The plasma processing apparatus according to claim 18, wherein the plasma generation mechanism is of an RLSA (radial line slot antenna) microwave type, ECR (electron cyclotron resonance) type, ICP (inductively coupled plasma) type, surface wave type, or magnetron type as a type of plasma generation.

20. The plasma processing apparatus according to claim 18, wherein the plasma generation mechanism includes a planar antenna with a plurality of side slots formed therein, by which microwaves are supplied into the process chamber to generate plasma.

* * * * *